(12) United States Patent
Kirschner et al.

(10) Patent No.: US 9,825,587 B1
(45) Date of Patent: Nov. 21, 2017

(54) MITIGATION OF LONG WAKE-UP DELAY OF A CRYSTAL OSCILLATOR

(71) Applicant: Nuvoton Technology Corporation, Hsin-chu (TW)

(72) Inventors: Yuval Kirschner, Even Yehuda (IL); Nimrod Peled, Ganei Tikva (IL); Michal Schramm, Tel Aviv (IL); Victor Adrian Flachs, Rishon Le-Zion (IL); Ofer Cohen, Kibbutz Shefayim (IL)

(73) Assignee: NUVOTON TECHNOLOGY CORPORATION, Hsin-Chu (TW)

( * ) Notice: Subject to any disclaimer, the term of this patent is extended or adjusted under 35 U.S.C. 154(b) by 0 days.

(21) Appl. No.: 15/215,619

(22) Filed: Jul. 21, 2016

(51) Int. Cl.
*H03K 17/00* (2006.01)
*H03B 5/06* (2006.01)
*H03B 5/32* (2006.01)
*H03K 19/00* (2006.01)
*H03K 21/40* (2006.01)

(52) U.S. Cl.
CPC .................. *H03B 5/06* (2013.01); *H03B 5/32* (2013.01); *H03K 19/0016* (2013.01); *H03K 21/40* (2013.01)

(58) Field of Classification Search
CPC ....................................................... H03B 5/06
See application file for complete search history.

(56) References Cited

U.S. PATENT DOCUMENTS 8,237,513 B2 * 8/2012 Muench .................... H03L 3/00
331/2

OTHER PUBLICATIONS

Microchip Technology Inc., "Keyboard and Embedded Controller for Notebook PC", MEC170X, 643 pages, Jul. 11, 2016.

* cited by examiner

*Primary Examiner* — Daniel Puentes
(74) *Attorney, Agent, or Firm* — D.Kligler IP Services Ltd.

(57) ABSTRACT

An electronic circuit includes a first oscillator, a second oscillator and ancillary circuitry. The first oscillator is configured to generate a first clock signal and has a first wake-up delay. The second oscillator is configured to generate a second clock signal and has a second wake-up delay that is shorter than the first wake-up delay. The ancillary circuitry is configured to provide the second clock signal as an output clock signal during wake-up of the first oscillator, and, following the first wake-up delay, to provide the first clock signal as the output clock signal.

15 Claims, 2 Drawing Sheets

MITIGATION OF LONG WAKE-UP DELAY OF A CRYSTAL OSCILLATOR

FIELD OF THE INVENTION

The present invention relates generally to oscillator circuits, and particularly to methods and systems for mitigating wake-up delays of crystal oscillators.

BACKGROUND OF THE INVENTION

Crystal oscillators are used in various applications, such as for generating accurate clock signals in various types of electronic equipment.

Although accurate, some crystal oscillators, often low-power oscillators, are characterized by slow wake-up.

SUMMARY OF THE INVENTION

An embodiment of the present invention that is described herein provides an electronic circuit including a first oscillator, a second oscillator and ancillary circuitry. The first oscillator is configured to generate a first clock signal and has a first wake-up delay. The second oscillator is configured to generate a second clock signal and has a second wake-up delay that is shorter than the first wake-up delay. The ancillary circuitry is configured to provide the second clock signal as an output clock signal during wake-up of the first oscillator, and, following the first wake-up delay, to provide the first clock signal as the output clock signal.

In some embodiments, the first oscillator has a first accuracy, and the second oscillator has a second accuracy that is poorer than the first accuracy. In some embodiments, the first oscillator includes a crystal oscillator, and the second oscillator includes a free-running oscillator.

In a disclosed embodiment, the ancillary circuitry includes a multiplexer, configured to switch either the first clock signal or the second clock signal to an output over which the output clock signal is provided, and a counter, configured to count a predefined delay and, upon expiry of the predefined delay, to switch the multiplexer from outputting the second clock signal to outputting the first clock signal.

In an alternative embodiment, the ancillary circuitry includes a multiplexer, configured to switch either the first clock signal or the second clock signal to an output over which the output clock signal is provided, and a detector circuit, configured to switch the multiplexer from outputting the second clock signal to outputting the first clock signal in response to detecting that the crystal oscillator reached a predefined expected performance.

In an embodiment, the second oscillator or the ancillary circuitry is configured to disable the second oscillator after starting to provide the first clock signal as the output clock signal.

There is additionally provided, in accordance with an embodiment of the present invention, a method for clock generation. The method includes generating a first clock signal by a first oscillator having a first wake-up delay, and generating a second clock signal by a second oscillator, which has a second wake-up delay that is shorter than the first wake-up delay. The second clock signal is provided as an output clock signal during wake-up of the first oscillator, and the first clock signal is provided as the output clock signal following the first wake-up delay.

There is also provided, in accordance with an embodiment of the present invention, an electronic apparatus including electronic circuitry and clock generation circuitry. The electronic circuitry is clocked by a clock signal. The clock generation circuitry includes a first oscillator, a second oscillator and ancillary circuitry. The first oscillator is configured to generate a first clock signal and has a first wake-up delay. The second oscillator is configured to generate a second clock signal and has a second wake-up delay that is shorter than the first wake-up delay. The ancillary circuitry is configured to clock the electronic circuitry with the second clock signal during wake-up of the first oscillator, and, following the first wake-up delay, to clock the electronic circuitry with the first clock signal.

The present invention will be more fully understood from the following detailed description of the embodiments thereof, taken together with the drawings in which:

DETAILED DESCRIPTION OF EMBODIMENTS

Overview

Embodiments of the present invention that are described herein provide improved methods and systems for mitigating the relatively long wake-up delays of crystal oscillators. The disclosed techniques can be used, for example, for generating a clock signal in a mobile computing device, or in any other application that calls for a clock signal that is both accurate and fast-waking. Typically although not necessarily, such applications tend to be low-power applications.

In some embodiments, an output clock signal is generated by clock generation circuitry. The clock generation circuitry comprises a crystal oscillator, a free-running oscillator, and ancillary circuitry. The free-running oscillator is typically less accurate than the crystal oscillator, but on the other hand has a considerably shorter wake-up delay.

In some embodiments, although not necessarily, the free-running oscillator may be smaller in size than the crystal oscillator, and/or consume less power. In some embodiments, the free-running oscillator may be implemented entirely inside the device that uses the clock signal (e.g., a silicon IC), whereas the crystal oscillator may be implemented at least partially outside the device and therefore require dedicated device pins and external components such as a crystal, capacitors and/or resistors.

In some embodiments, both the crystal oscillator and the free-running oscillator are started at power-up. In addition, a counter in the ancillary circuitry starts counting a predefined delay. The counter is typically clocked by the free-running oscillator. Initially, before the counter expires, the ancillary circuitry provides the output of the free-running oscillator as the output clock signal. After the counter expires, the ancillary circuitry starts providing the output of the crystal oscillator as an output clock signal.

For example, the ancillary circuitry may comprise a multiplexer that selects, depending on the counter status, either the output of the crystal oscillator or the output of the free-running oscillator. The predefined delay counted by the counter is typically set to be at least the worst-case wake-up delay of the crystal oscillator. As such, when the counter expires, the crystal oscillator can be safely used as a stable, valid clock signal. An optional variation of self-disabling the free-running oscillator after switch-over to the crystal oscillator is also described.

System Description

Figure 1:
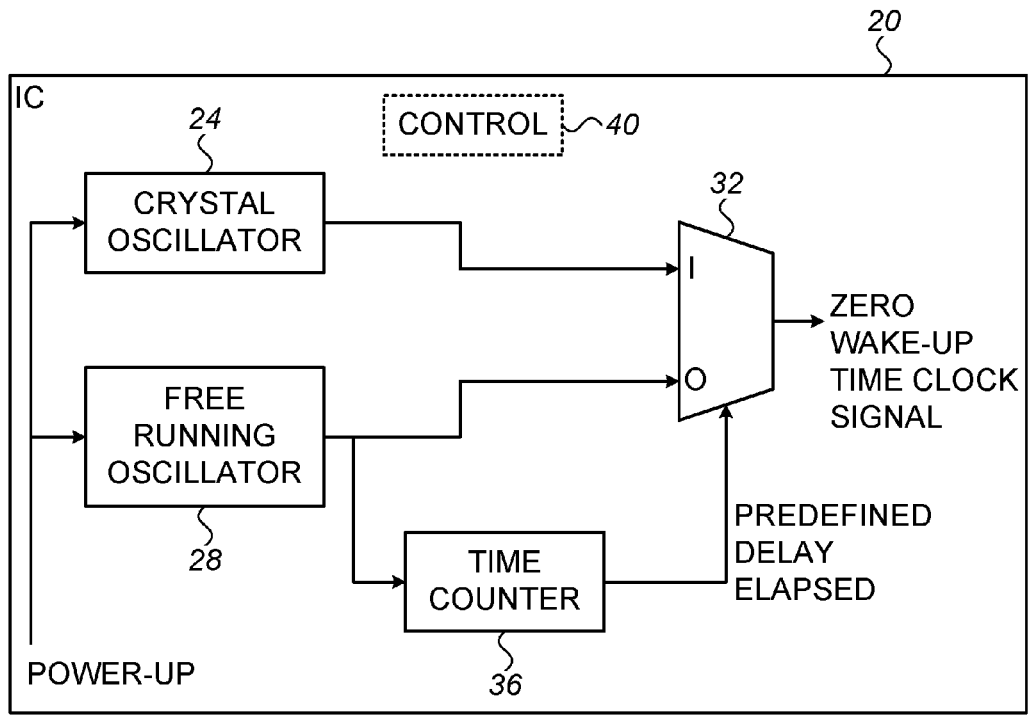
FIG. 1 is a block diagram that schematically illustrates an Integrated Circuit (IC) comprising fast wake-up clock generation circuitry, in accordance with an embodiment of the present invention.

FIG. 1 is a block diagram that schematically illustrates an Integrated Circuit (IC) 20 comprising fast wake-up clock generation circuitry, in accordance with an embodiment of the present invention. In the present example, IC 20 is part of a mobile or laptop computer. In alternative embodiments, the disclosed clock generation schemes can be used in any other suitable kind of electronic equipment.

In the embodiment of FIG. 1, the clock generation circuitry in IC 20 comprises a crystal oscillator 24, a free-running oscillator 28, and ancillary circuitry that comprises a multiplexer (MUX) 32, a time counter 36 and (optionally) a control module 40. MUX 32 receives the outputs of crystal oscillator 24 and of free-running oscillator 28 as inputs, and selectably outputs one of them. The clock signal at the output of MUX 32 is referred to as an output clock signal produced by the clock generation circuitry. MUX 32 is controlled by counter 36 (or at least depending on the expired/not-expired status of counter 36).

Crystal oscillator 24 is regarded as a primary oscillator, and it is used for producing the output clock signal under normal, steady-state conditions. Crystal oscillator 24 is typically highly accurate, e.g., on the order of several tens of parts-per-million (ppm). Crystal oscillator 24 typically has a long wake-up delay. In an example embodiment, the wake-up delay of crystal oscillator 24 is on the order of several hundred milliseconds.

In some embodiments, the clock generation circuitry uses free-running oscillator 28 for generating the output clock signal during the long wake-up delay of crystal oscillator 24. Oscillator 28 is thus also referred to as a secondary oscillator. Free-running oscillator 28 is typically much less accurate than crystal oscillator 24, e.g., on the order of 2-3% when calibrated over temperature and process variations, or several tens of % without calibration. Typically, a device that is calibrated during manufacturing will only be calibrated to compensate for process variations. A temperature compensation circuit may reduce variations over temperature.

Although less accurate, the wake-up delay of free-running oscillator 28 is significantly shorter than the wake-up delay of crystal oscillator 24. In some embodiments, free-running oscillator 28 produces a valid clock signal virtually immediately after it is started (e.g., upon power-up or reset). In other embodiments, the free-running oscillator has a short wake-up delay on the order of several microseconds or less.

In various embodiments, free-running oscillator 28 may comprise, for example, a Resistance-Capacitance (RC) oscillator, a ring oscillator, or any other suitable oscillator type.

In the context of the present patent application and in the claims, the term "accuracy" of an oscillator (oscillator 24 or oscillator 28) may refer to the absolute long-term frequency accuracy, short-term jitter or wander, phase noise, and/or any other suitable measure relating to frequency accuracy.

In the context of the present patent application and in the claims, the term "wake-up delay" of an oscillator (oscillator 24 or oscillator 28) is defined as the delay from the time the oscillator is started (e.g., from power-up or reset) until the clock signal produced by the oscillator meets its specified performance. The specified performance may relate, for example, to amplitude, frequency accuracy, stability, spectral purity, or any other suitable performance measure.

The configuration of the clock generation circuitry shown in FIG. 1 is an example configuration that is depicted purely for the sake of conceptual clarity. In alternative embodiments, any other suitable configuration can be used. For example, instead of counter 36, the clock generation circuitry may comprise a detector circuit that verifies the performance of crystal oscillator 24 and detects whether the crystal oscillator reached some predefined expected performance. The expected performance may comprise a target amplitude of the clock signal, or any other suitable parameter that indicates the crystal oscillator completed its stabilization process. In these embodiments, the detector circuit controls MUX 32, e.g., switches-over from free-running oscillator 28 to crystal oscillator 24 in response to detecting that the crystal oscillator reached the predefined expected performance. Using a detector circuit instead of a counter may achieve earlier switch-over, since it depends on the actual performance of the crystal oscillator and not on worst-case performance.

Typically, crystal oscillator 24 and free-running oscillator 28 generate clock signals having the same frequency. Alternatively, however, the two oscillators may generate clock signals having different frequencies. In such embodiments, the ancillary circuitry comprises one or more frequency dividers or multipliers that match the frequencies of the two clock signals as they arrive at MUX 32.

In various embodiments, the different elements of the clock generation circuitry may be implemented using any suitable hardware, such as in an Application-Specific Integrated Circuit (ASIC) or Field-Programmable Gate Array (FPGA).

Mitigation of Crystal-Oscillator Wake-Up Delay Using Free-Running Oscillator

Figure 2:
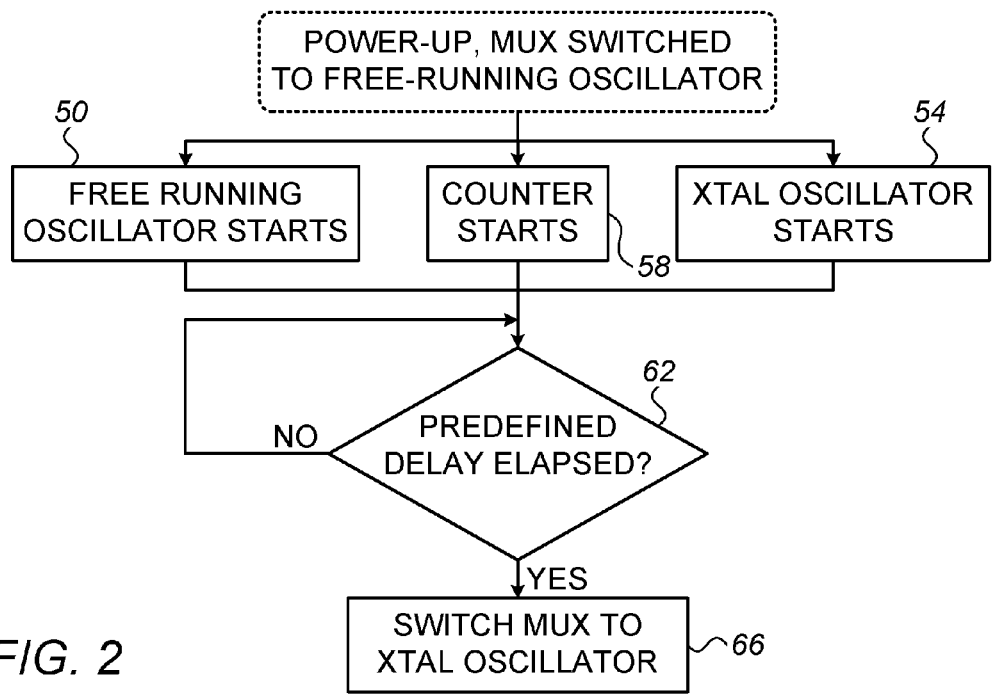
FIG. 2 is a flow chart that schematically illustrates a method for fast generation of a clock signal, in accordance with an embodiment of the present invention.

FIG. 2 is a flow chart that schematically illustrates a method for fast generation of a clock signal, in accordance with an embodiment of the present invention. The method begins at power-up of IC 20, or part thereof. Initially, by default, MUX 32 is set to provide the output of free-running oscillator 28 as the output clock signal.

Three events are triggered, typically simultaneously, at power-up: Free-running oscillator 28 starts operating, at a secondary oscillator start-up step 50. Crystal oscillator 24 starts operating, at a primary oscillator start-up step 54. Counter 36 starts counting, at a counter start-up step 58.

Following step 50, a valid output clock signal appears virtually immediately at the output of MUX 32. At this stage the output clock signal is generated by free-running oscillator 28, and therefore has somewhat degraded accuracy.

Counter 36 is configured to measure a predefined time delay. In some embodiments, the predefined delay is set to be at least the worst-case wake-up delay of crystal oscillator 24. The worst-case wake-up delay typically considers the full range of operating conditions specified for oscillator 24, e.g., taken over the full voltage and temperature range. In addition, the worst-case wake-up delay may also consider manufacturing process variations from one crystal oscillator to another. If the wake-up delay of oscillator 24 is expected to deteriorate over its lifetime, this factor may also be taken into account. In addition, a suitable margin may be added. When the above factors are considered correctly, it is guaranteed that when counter 26 expires, crustal oscillator 24 is stable and produces a valid and accurate clock signal. In alternative embodiments, however, the predefined delay can be set to any other suitable value.

In the present example, counter 36 counts the predefined delay using the clock signal generated by free-running oscillator 28 (since the output of crystal oscillator 24 may not be dependable at this stage). In an alternative embodiment, the counter may be clocked by crystal oscillator 24, not by free-running oscillator 28. In such an embodiment, the counter starts counting when the crystal oscillator starts oscillating, and counts a predefined number of cycles after which the crystal oscillator is known to stabilize under worst-case conditions.

At a counter checking step 62, counter 36 checks whether the predefined delay has expired. When the predefined delay expires, at a switch-over step 66, counter 36 switches MUX 32 to provide the output of crystal oscillator 24 as the output clock signal. From this point, the output clock signal is produced by crystal oscillator 24, and is therefore highly accurate.

In some embodiments, the switch-over of step 66 is designed such that the transition of the output clock signal from the free-running oscillator to the crystal oscillator is seamless and introduces little or no transient response. An example implementation of MUX 32 that meets this condition is shown in FIG. 3 below.

In some embodiments, certain functions described above may be performed by control module 40. The control module may, for example, start oscillators 24 and 28 upon power-up or reset, configured counter 36 with the predefined delay, start counter 36, initialize MUX 32, and/or switch MUX 32 in response to expiry of counter 36. Alternatively, any or all of these functions may be performed by logic that is coupled to the oscillators, counter and/or MUX, or by any other element of the ancillary circuitry.

In some embodiments, free-running oscillator 28 self-disables after step 66, i.e., after switching over to take the output clock signal from crystal oscillator 24. This feature helps to reduce power consumption. Alternatively, disabling of free-running oscillator 28 may be performed by any element of the ancillary circuitry, e.g., by control module 40.

Figure 3:
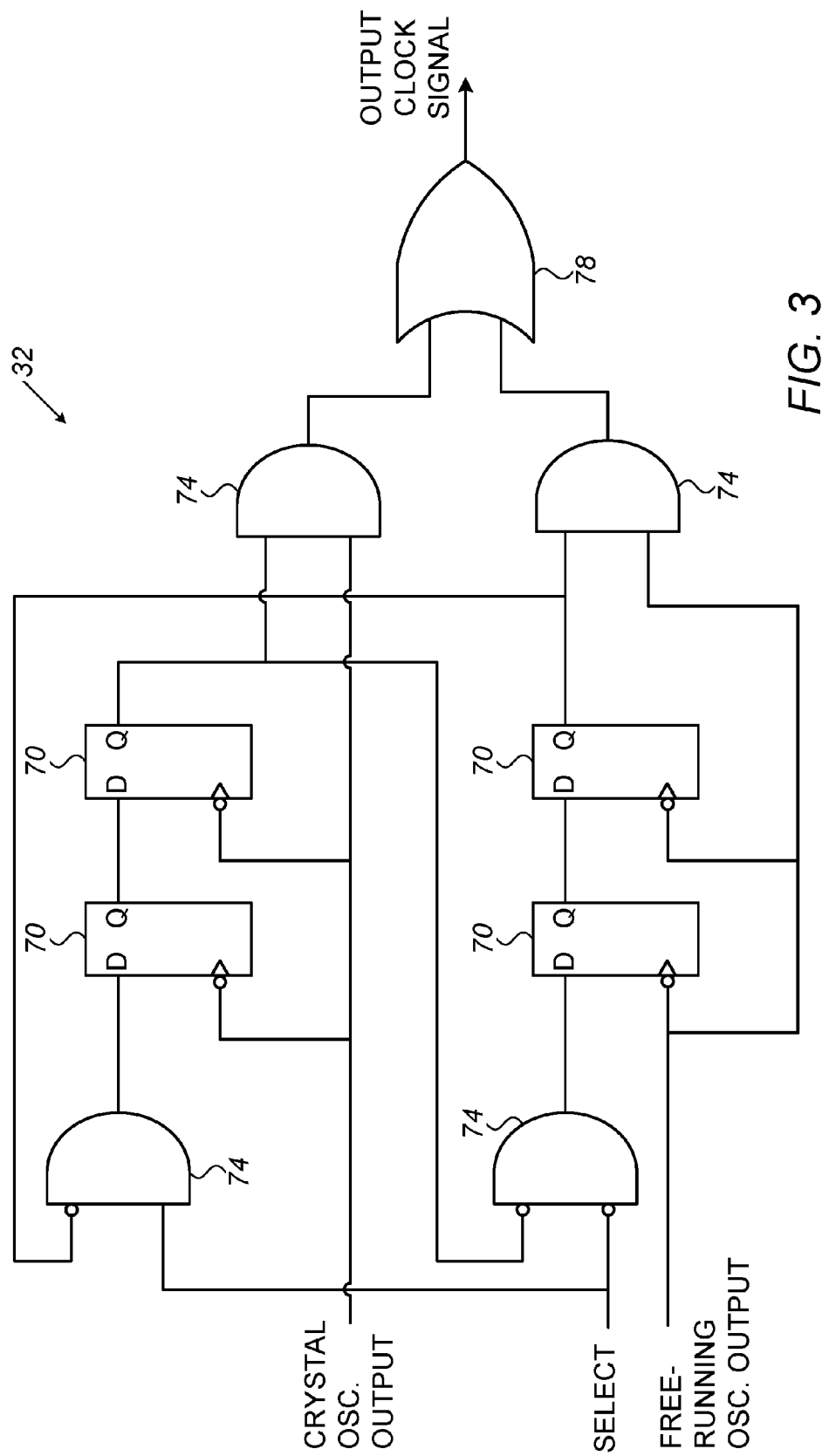
FIG. 3 is a circuit diagram of a clock multiplexer, in accordance with an example embodiment of the present invention.

FIG. 3 is a circuit diagram of MUX 32, in accordance with an example embodiment of the present invention. The MUX of FIG. 3 accepts two clock signals as inputs—The output of crystal oscillator 24 and the output of free-running oscillator 28. The circuit also accepts a SELECT signal (e.g., from counter 36) that instructs the circuit which clock signal to provide as the OUTPUT CLOCK SIGNAL output. The MUX circuit of FIG. 3 comprises four D-Flip-Flops (D-FF) 70, four AND gates 74, and an OR gate 78.

Typically, all four FFs 70 have asynchronous reset inputs that are connected to a reset signal, in order ensure the clock output default after power-up. This feature is not shown in the figure, for clarity.

Assuming both clock signals are toggling during switch-over, and assuming the SELECT signal is by default "0" (i.e., selecting the output of the free-running oscillator), switching-over the SELECT signal to "1" will cause the OUTPUT CLOCK SIGNAL to switch to the output of the crystal oscillator seamlessly without any glitch.

Although the embodiments described herein mainly address a free-running oscillator that operates in conjunction with a crystal oscillator, the methods and systems described herein can also be used in other applications, such as with various other suitable types of oscillators. In such alternative embodiments, the slow wake-up time of any kind of oscillator ("primary oscillator") can be mitigated by complementing it with a faster-waking oscillator ("secondary oscillator") that produces the output clock signal during the wake-up time of the primary oscillator.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An electronic circuit, comprising:
a crystal oscillator, which is configured to generate a first clock signal and which has a first wake-up delay;
a free-running oscillator, which is configured to generate a second clock signal and which has a second wake-up delay that is shorter than the first wake-up delay; and
ancillary circuitry, which is configured to provide the second clock signal as an output clock signal during wake-up of the crystal oscillator, and, following the first wake-up delay, to provide the first clock signal as the output clock signal.

2. The circuit according to claim 1, wherein the crystal oscillator has a first accuracy, and wherein the free-running oscillator has a second accuracy that is poorer than the first accuracy.

3. The circuit according to claim 1, wherein the ancillary circuitry comprises:
a multiplexer, configured to switch either the first clock signal or the second clock signal to an output over which the output clock signal is provided; and
a counter, configured to count a predefined delay and, upon expiry of the predefined delay, to switch the multiplexer from outputting the second clock signal to outputting the first clock signal.

4. The circuit according to claim 1, wherein the ancillary circuitry comprises:
a multiplexer, configured to switch either the first clock signal or the second clock signal to an output over which the output clock signal is provided; and
a detector circuit, configured to switch the multiplexer from outputting the second clock signal to outputting the first clock signal in response to detecting that the crystal oscillator reached a predefined expected performance.

5. The circuit according to claim 1, wherein the free-running oscillator or the ancillary circuitry is configured to disable the free-running oscillator after starting to provide the first clock signal as the output clock signal.

6. A method for clock generation, comprising:
generating a first clock signal by a crystal oscillator, which has a first wake-up delay;

generating a second clock signal by a free-running oscillator, which has a second wake-up delay that is shorter than the first wake-up delay; and providing the second clock signal as an output clock signal during wake-up of the crystal oscillator, and, following the first wake-up delay, providing the first clock signal as the output clock signal.

7. The method according to claim 6, wherein the crystal oscillator has a first accuracy, and wherein the free-running oscillator has a second accuracy that is poorer than the first accuracy.

8. The method according to claim 6, wherein providing the second clock signal and the first clock signal comprise counting a predefined delay and, upon expiry of the predefined delay, switching a multiplexer from outputting the second clock signal to outputting the first clock signal as the output clock signal.

9. The method according to claim 6, wherein providing the second clock signal and the first clock signal comprise switching a multiplexer from outputting the second clock signal to outputting the first clock signal as the output clock signal in response to detecting that the crystal oscillator reached a predefined expected performance.

10. The method according to claim 6, and comprising disabling the free-running oscillator after starting to provide the first clock signal as the output clock signal.

11. An electronic apparatus, comprising:
electronic circuitry, which is clocked by a clock signal; and
clock generation circuitry, comprising:
a crystal oscillator, which is configured to generate a first clock signal and which has a first wake-up delay;
a free-running oscillator, which is configured to generate a second clock signal and which has a second wake-up delay that is shorter than the first wake-up delay; and
ancillary circuitry, which is configured to clock the electronic circuitry with the second clock signal during wake-up of the crystal oscillator, and, following the first wake-up delay, to clock the electronic circuitry with the first clock signal.

12. The apparatus according to claim 11, wherein the crystal oscillator has a first accuracy, and wherein the free-running oscillator has a second accuracy that is poorer than the first accuracy.

13. The apparatus according to claim 11, wherein the ancillary circuitry comprises:
a multiplexer, configured to switch either the first clock signal or the second clock signal to clock the electronic circuitry; and
a counter, configured to count a predefined delay, and upon expiry of the predefined delay to switch the multiplexer from outputting the second clock signal to outputting the first clock signal.

14. The apparatus according to claim 11, wherein the ancillary circuitry comprises:
a multiplexer, configured to switch either the first clock signal or the second clock signal to clock the electronic circuitry; and
a detector circuit, configured to switch the multiplexer from outputting the second clock signal to outputting the first clock signal in response to detecting that the crystal oscillator reached a predefined expected performance.

15. The apparatus according to claim 11, wherein the free-running oscillator or the ancillary circuitry is configured to disable the free-running oscillator after starting to clock the electronic circuitry with the first clock signal.

\* \* \* \* \*